United States Patent
Blake et al.

(10) Patent No.: US 7,505,855 B2
(45) Date of Patent: *Mar. 17, 2009

(54) MULTI-CHANNEL AMPLIFIER HAVING PROGRAMMABLE OPERATIONAL CHARACTERISTICS CONTROLLED WITH A SERIAL INTERFACE

(75) Inventors: Kumen E. Blake, Gilbert, AZ (US); James B. Nolan, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 421 days.

This patent is subject to a terminal disclaimer.

(21) Appl. No.: 11/040,354

(22) Filed: Jan. 21, 2005

(65) Prior Publication Data
US 2005/0143942 A1 Jun. 30, 2005

Related U.S. Application Data

(63) Continuation-in-part of application No. 10/374,016, filed on Feb. 25, 2003, now Pat. No. 6,847,904.

(51) Int. Cl.
H03F 3/00 (2006.01)

(52) U.S. Cl. .......................... 702/57; 702/124; 327/651; 330/278

(58) Field of Classification Search .................. 702/57, 702/65, 75, 117, 124, 189; 341/138–139, 341/141; 327/50–57, 68, 113–123, 306, 327/333, 560–563, 323, 552–555; 330/278, 330/302–303, 306–307, 107, 109, 254, 260
See application file for complete search history.

(56) References Cited

U.S. PATENT DOCUMENTS

| 4,378,527 | A | * | 3/1983 | Beauducel et al. ............ 330/86 |
| 4,812,773 | A | * | 3/1989 | Yamamoto et al. ............ 327/553 |
| 5,367,474 | A | * | 11/1994 | Auer et al. ..................... 702/21 |
| 5,390,132 | A | * | 2/1995 | Shioe et al. .................. 709/224 |
| 5,574,678 | A | * | 11/1996 | Gorecki ....................... 708/801 |
| 5,604,757 | A | * | 2/1997 | Liang et al. ............... 372/38.04 |
| 5,751,234 | A | * | 5/1998 | Schlotterer et al. .......... 341/139 |
| 5,808,575 | A | * | 9/1998 | Himeno et al. .............. 341/139 |
| 5,886,658 | A | * | 3/1999 | Amar et al. .................. 341/155 |
| 5,986,357 | A | * | 11/1999 | Myron et al. ................ 307/116 |
| 6,184,660 | B1 | * | 2/2001 | Hatular ........................ 320/141 |
| 6,226,322 | B1 | * | 5/2001 | Mukherjee ................... 375/229 |
| 6,424,209 | B1 | * | 7/2002 | Gorecki et al. .............. 327/554 |
| 6,542,035 | B2 | * | 4/2003 | Cook et al. .................. 330/286 |

(Continued)

OTHER PUBLICATIONS

Blake, K.E., A Simplified-Transistor Macromodel of a High-Speed Multiplier/VGA, Aug. 1993, Circuits and Systems, 1993, vol. 2, pp. 1349-1352.

*Primary Examiner*—Eliseo Ramos Feliciano
*Assistant Examiner*—Mary C Baran
(74) *Attorney, Agent, or Firm*—Baker Botts L.L.P.

(57) ABSTRACT

An amplifier having programmable operational characteristics and a serial communications interface is fabricated on an integrated circuit (IC). The serial communications interface controls the operational characteristics, e.g., gain, frequency response, etc., of the amplifier. A multiplexer (MUX) may also be included on the IC and may be controlled by the serial communications interface. Status of the amplifier may also be obtained through the serial communications interface. The pin count of the IC package may be kept to a minimum by using the serial communications interface.

29 Claims, 2 Drawing Sheets

U.S. PATENT DOCUMENTS

| | | | |
|---|---|---|---|
| 6,628,170 B2 * | 9/2003 | Titus | 330/278 |
| 6,664,858 B2 * | 12/2003 | Feng | 330/308 |
| 6,847,904 B2 | 1/2005 | Blake et al. | 702/57 |
| 2001/0037431 A1 * | 11/2001 | Hamamoto et al. | 711/115 |

* cited by examiner

MULTI-CHANNEL AMPLIFIER HAVING PROGRAMMABLE OPERATIONAL CHARACTERISTICS CONTROLLED WITH A SERIAL INTERFACE

RELATED PATENT APPLICATION

This application is a continuation-in-part of and claims priority to commonly owned U.S. patent application Ser. No. 10/374,016, filed Feb. 25, 2003, now U.S. Pat. No. 6,847,904 issued Jan. 25, 2005; entitled "Multi-Channel Programmable Gain Amplifier Controlled with a Serial Interface," by Kumen E. Blake and James B. Nolan; which is hereby incorporated by reference herein for all purposes.

TECHNICAL FIELD OF THE INVENTION

The present invention generally relates to integrated circuit programmable gain amplifiers, and more particularly to an integrated circuit multi-channel programmable gain amplifier having operational characteristics controlled with a serial interface.

BACKGROUND OF THE RELATED TECHNOLOGY

Programmable gain amplifiers (PGAs) may be used to amplify analog signals from sensors that measure, for example, temperature, pressure, humidity, vibration, pH, flow, etc. Usually, the amplified signals of the sensors are coupled to an analog-to-digital converter (ADC) which samples the analog signal values. The ADC digital output may be coupled to a digital signal processor (DSP) for further processing of the amplified signal information from these sensors.

The various sensors may require sampling at different rates since fast-changing signals must be processed more frequently than slower-changing signals (e.g., Nyquist sampling rate). In addition, different sensors may produce signals having different amplitudes that require different amplifier gains so as to fully utilize the dynamic range of the ADC.

A PGA typically switches resistance values in its feedback circuit to select different gains. There also may be an analog input multiplexer (MUX) for selecting between a multiple number of analog input channels to the PGA. In a microcontroller system it is therefore necessary to control the gain switches and the analog input MUX to the PGA. In addition, it is useful to be able to send various other commands to the PGA, e.g., bandwidth, power draw, auto-calibrate, auto-offset zero, etc., and/or to read back the status or other data pertaining to operation of the PGA and/or the MUX.

PGAs have been built using discrete amplifiers, resistors, switches and MUXs. However, the resulting system has been costly in terms of printed circuit board space, power consumption and the number of discrete components required. Performance has also suffered because of component mismatch, circuit drift and parasitic capacitances. Some integrated circuit (IC) implementations have been developed for a PGA, but these PGA ICs lack flexible control and do not have multiple input channel capabilities for handling a plurality of sensors. Without multiple input channel capabilities, system-level calibration of gain and offset is not possible since there can be no dedicated input channel for calibration to a reference signal.

Presently, discrete logic inputs are used in PGA ICs to control the PGA functions, including gain. For example, three input pins of the PGA IC may be dedicated to selecting one of eight gain settings. Other pins may be used for device selection, power-down sleep mode, read status, write control data, etc. However, these control and status pins of the PGA IC add additional pin count to the IC device, increasing the IC package size and cost.

SUMMARY OF THE INVENTION

Therefore, there is a needed for flexible control, configuration and determining status of an integrated circuit (IC) amplifier having programmable operational characteristics, e.g., programmable gain amplifier (PGA), without having to materially increase the pin count of the integrated circuit package.

The invention overcomes the above-identified problems as well as other shortcomings and deficiencies of existing technologies by providing an integrated circuit (IC) amplifier having programmable operational characteristics, e.g., programmable through a serial communications interface that is adapted to communicate with the amplifier control and status circuits, and, in addition, to control an analog input MUX in combination with the amplifier in the IC package.

In accordance with an exemplary embodiment of the present invention, an amplifier, e.g., at least one operational amplifier, having programmable operational characteristics and a serial communications interface are fabricated on an IC. The serial communications interface, e.g., serial peripheral interface (SPI), Inter-Integrated Circuit ($I^2C$), System Management Bus (SMBus) and the like, may be used to control the programmable operational characteristics of the amplifier, e.g., gain, bandwidth, power consumption, input offset correction, frequency response, high pass filter frequency cutoff, low pass filter frequency cutoff, band pass filter frequency, phase delay, quality (Q), etc. Preferably, the operational characteristics setting elements, e.g., gain and/or frequency setting resistors, diodes, transistors, capacitors and/or inductors for the programmable operational characteristics amplifier, and programmable operational characteristics setting element selection switches, e.g., diodes, transistors (bipolar, field effect, etc., preferably metal oxide semiconductor field effect—MOSFET), may be part of the IC. It is contemplated and within the scope of the invention that any of the operational characteristics setting elements (e.g., resistors, diodes, transistors, capacitors and/or inductors) of the amplifier, and/ or operational characteristics setting element selection switches may be located off of the IC. The operational characteristics setting element selection switches may be positioned between the operational characteristics setting elements and the high-impedance inverting input of the at least one operational amplifier for reducing distortion, increasing bandwidth, frequency response shaping and improving gain accuracy.

In accordance with another exemplary embodiment of the present invention, an amplifier, e.g., at least one operational amplifier, having programmable operational characteristics, an analog input multiplexer (MUX) and a serial communications interface are fabricated on an IC. The serial communications interface, e.g., serial peripheral interface (SPI), Inter-Integrated Circuit ($I^2C$), System Management Bus (SMBus) and the like, may be used to control the programmable operational characteristics of the amplifier, e.g., gain, bandwidth, power consumption, input offset correction, frequency response, high pass filter frequency cutoff, low pass filter frequency cutoff, band pass filter frequency, phase delay, and quality (Q), etc., and selects the analog input channel of the MUX that is connected to the amplifier analog input. Preferably, the operational characteristics setting elements, e.g., gain and/or frequency setting resistors, diodes, transistors, capacitors and/or inductors for the amplifier, and operational characteristics setting element selection switches, e.g., diodes, transistors (bipolar, field effect, etc., preferably metal oxide semiconductor field effect—MOSFET), may be part of the IC. It is contemplated and within the scope of the invention that any of the operational characteristics setting elements (e.g., resistors, diodes, transistors, capacitors and/or inductors) for the programmable amplifier, and/or operational characteristics setting element selection switches may be located off of the IC. The operational characteristics setting element selection switches, e.g., diodes, transistors (bipolar, field effect, etc., preferably metal oxide semiconductor field effect—MOSFET), may be positioned between the operational characteristics setting elements and the high-impedance inverting input of the operational amplifier for reducing distortion, increasing bandwidth, frequency response shaping and improving gain accuracy.

The serial peripheral interface (SPI) requires only three pins of the IC, e.g., $\overline{CS}$ (chip select, active low), SCK (serial clock input) and SI (serial data input) to communicate with, for example, a microcontroller. Data and commands are sent to the programmable operational characteristics amplifier and/or the MUX by appropriate timing on these three pins. In general, data may be shifted into the programmable operational characteristics amplifier control circuits when $\overline{CS}$ is low and SCK toggles. When SCK changes its logic level (e.g., rising or falling edge of the clock waveform), data on the SI pin is shifted into the amplifier control circuit. This data may be latched in the amplifier control circuit and acted upon at the rising edge of the signal on the $\overline{CS}$ pin. The serial communications interface saves valuable pin count on the IC package and printed circuit board real estate.

In addition, a serial data output (SO) pin is optional to allow daisy chaining to other peripheral devices, each using the same $\overline{CS}$ signal. This saves additional chip select pins on the microcontroller package. In a similar fashion, the Inter-Integrated Circuit ($I^2C$) may be used for control and status of the programmable operational characteristics amplifier and/or MUX. The serial communications interface is well suited for communicating with digital processor-based systems, e.g., microprocessor, microcontroller, digital signal processor (DSP), programmable logic array (PLA), application specific integrated circuit (ASIC) and the like.

The present invention may be one or more integrated circuit dice un-packaged on a leadframe or substrate, or encapsulated in a plastic, epoxy and/or ceramic integrated circuit package, e.g., PDIP, SOIC, MSOP, TSSOP, QSOP and the like.

According to an exemplary embodiment of the present invention, an integrated circuit amplifier having programmable operational characteristics, comprises: at least one operational amplifier; operational characteristics setting elements for setting the operational characteristics of the at least one operational amplifier; operational characteristics setting element selection switches coupled between the operational characteristics setting elements and the at least one operational amplifier; and a serial communications interface, wherein the serial communications interface controls the operational characteristics setting element selection switches. The integrated circuit programmable operational characteristics amplifier may further comprise an analog multiplexer having a plurality of analog inputs and an analog output, the analog output coupled to an input of at least one operational amplifier. The integrated circuit programmable operational characteristics amplifier may further comprise an analog multiplexer having a plurality of analog inputs and a plurality of analog outputs, the plurality of analog outputs coupled to inputs of respective ones of the at least one operational amplifiers. The analog multiplexer may be controlled by the serial communications interface. The integrated circuit programmable operational characteristics amplifier may further comprise a power-on-reset circuit for setting the serial communications interface to a predetermined state. The integrated circuit programmable operational characteristics amplifier may further comprise a memory coupled to the serial communications interface. The memory may be volatile and/or non-volatile.

According to another exemplary embodiment of the present invention, a method for controlling an integrated circuit amplifier having programmable operational characteristics, comprises an operational amplifier, operational characteristics setting elements for determining operational characteristics of the operational amplifier, operational characteristics setting element selection switches for coupling the operational characteristics setting elements to the operational amplifier and a serial communications interface, said method comprising the step of controlling the operational characteristics setting element selection switches with the serial communications interface, and selecting the operational characteristics setting elements to be coupled to the operational amplifier with the operational characteristics setting element selection switches, whereby the operational amplifier operational characteristics are determined with the serial communications interface. The method may further comprise the step of controlling the operational amplifier power consumption with the serial communications interface. The method may further comprise the steps of controlling the operational amplifier bandwidth with the serial communications interface. The method may further comprise the step of controlling the operational amplifier input offset correction with the serial communications interface. The method may further comprise the step of controlling the operational amplifier frequency response with the serial communications interface. The method may further comprise the step of controlling a plurality of analog inputs to the operational amplifier with a multiplexer (MUX) controlled by the serial communications interface. The step of controlling the characteristics of the operational amplifier may comprise the steps of: controlling the operational characteristics selection switches with the serial communications interface; and selecting the operational characteristics setting elements to be coupled to the operational amplifier with the operational characteristics setting element selection switches.

According to still another exemplary embodiment of the present invention, a method for controlling an integrated circuit amplifier having programmable operational characteristics, comprises a plurality of operational amplifiers, operational characteristics setting elements for determining operational characteristics for each of the plurality of operational amplifiers, operational characteristics setting element selection switches for coupling the operational characteristics setting elements to respective ones of the plurality of operational amplifiers and a serial communications interface, said method comprising the step of controlling the plurality of operational amplifier operational characteristics with the serial communications interface. The method may further comprise the step of controlling power consumption of each of the plurality of operational amplifiers with the serial communications interface. The method may further comprise the step of controlling bandwidth for each of the plurality of operational amplifiers with the serial communications interface. The method may further comprise the step of controlling input offset correction for each of the plurality of operational amplifiers with the serial communications interface. The method may further comprise the step of controlling frequency response for each of the plurality of operational amplifiers with the serial communications interface. The method may further comprise the step of controlling a plurality of analog inputs to each of the plurality of operational amplifiers with a multiplexer (MUX) controlled by the serial communications interface. The step of controlling the plurality of operational amplifier may comprise the steps of: controlling the operational characteristics setting element selection switches with the serial communications interface; and selecting the operational characteristics setting elements to be coupled to respective ones of the plurality of operational amplifiers with the operational characteristics setting element selection switches.

According to yet another exemplary embodiment of the present invention, a system for analog signal processing with an amplifier having programmable operational characteristics, comprises an operational amplifier; operational characteristics setting elements for setting operational characteristics of the operational amplifier; operational characteristics setting element selection switches coupled between the operational characteristics setting elements and the operational amplifier; and a serial communications interface, wherein the serial communications interface controls the operational characteristics setting element selection switches; an analog-to-digital converter, wherein an input of the analog-to-digital converter is coupled to an output of the operational amplifier; and a digital processor, wherein the digital processor is coupled to the output of the analog-to-digital converter and to the serial communications interface. The system may further comprise an analog multiplexer having a plurality of analog inputs and an analog output, the analog output coupled to an input of the operational amplifier. The analog multiplexer may be controlled by the serial communications interface.

According to still another exemplary embodiment of the present invention, a system for analog signal processing with an amplifier having programmable operational characteristics, comprises a plurality of operational amplifiers; operational characteristics setting elements for setting operational characteristics for each of the plurality of operational amplifiers; operational characteristics setting element selection switches coupled between the operational characteristics setting elements and the respective ones of the plurality of operational amplifiers; and a serial communications interface, wherein the serial communications interface controls the operational characteristics setting element selection switches; at least one analog-to-digital converter, wherein a respective input of the at least one analog-to-digital converter is coupled to an output of a respective one the plurality of operational amplifiers; and a digital processor, wherein the digital processor is coupled to the output of the at least one analog-to-digital converter and to the serial communications interface. The system may further comprise an analog multiplexer having a plurality of analog inputs and analog outputs, the plurality of analog outputs coupled to respective inputs of the plurality of operational amplifiers. The analog multiplexer may be controlled by the serial communications interface.

A technical advantage of the present invention is that it requires a minimum number of signal pins on an IC. Another technical advantage is a simple and standardized interface for controlling an amplifier having programmable operational characteristics and/or MUX of an IC.

Features and advantages of the invention will be apparent from the following description of the embodiments, given for the purpose of disclosure and taken in conjunction with the accompanying drawings.

BRIEF DESCRIPTION OF THE DRAWING

A more complete understanding of the present disclosure and advantages thereof may be acquired by referring to the following description taken in conjunction with the accompanying drawing, wherein.

Figure 1:
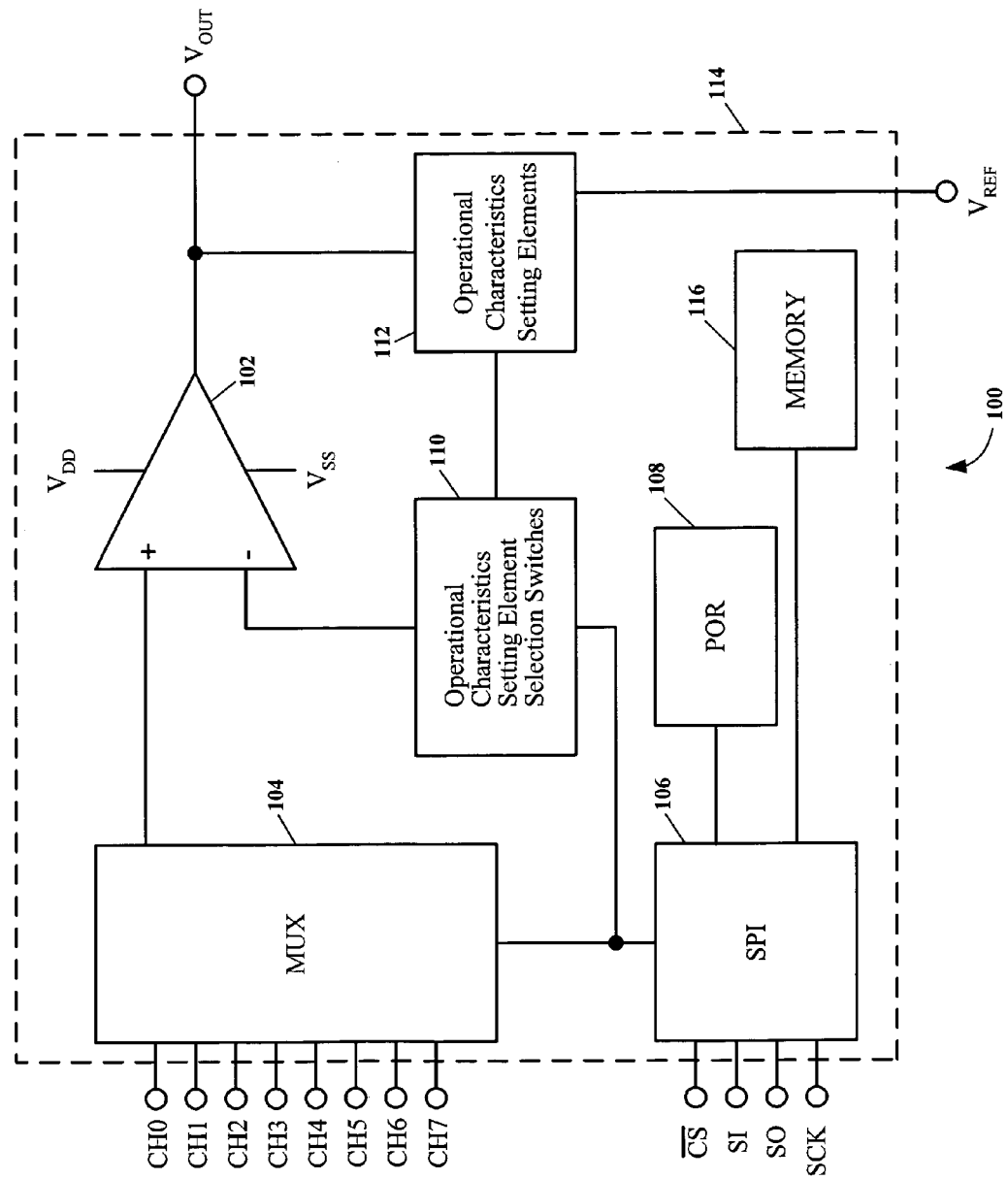
FIG. 1 illustrates schematic block diagram of an exemplary embodiment of the present invention.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of exemplary embodiments of the present invention are schematically illustrated. Like elements in the drawing will be represented by like numbers, and similar elements will be represented by like numbers with a different lower case letter suffix.

Referring to FIG. 1, depicted is a schematic block diagram of an exemplary embodiment of the present invention. An integrated circuit amplifier having programmable operational characteristics, e.g., programmable gain amplifier (PGA), generally represented by the numeral 100, comprises an operational amplifier 102, a multiplexer (MUX) 104, a serial peripheral interface (SPI) 106, operational characteristics setting element selection switches 110, and operational characteristics setting elements 112 (e.g., resistors, diodes, transistors, capacitors and/or inductors) in an integrated circuit 114. The operational amplifier 102 may be one or more operational amplifiers in the integrated circuit 114, each of the one or more operational amplifiers 102 having a output, $V_{out}$. In addition the amplifier 100 may also include a power-on-reset (POR) 108 and/or a memory 116 (volatile and/or non-volatile). The integrated circuit 114 may be one or more integrated circuit dice on a leadframe (not illustrated) or may be a flip-chip ball bonded to a substrate (not illustrated).

The one or more integrated circuit dice may be un-encapsulated on the leadframe or substrate, or may be encapsulated in an integrated circuit package, e.g., PDIP, SOIC, MSOP, TSSOP, QSOP and the like.

Another exemplary embodiment of the present invention does not have the MUX 104 with the integrated circuit die 114. The SPI 106 may control the operational amplifier 102 operational characteristics, e.g., gain, bandwidth, power consumption, input offset correction, frequency response, high pass filter frequency cutoff, low pass filter frequency cutoff, band pass filter frequency, phase delay, and quality (Q), etc. The SPI 106 may also control input offset calibration, bandwidth, frequency response shaping, power utilization, etc., of the operational amplifier 102. Optionally, the POR 108 may be used to reset and initialize the SPI 106 to a predetermined state during power-up. The SPI 106 may also operate under the serial peripheral interface (SPI), Inter-Integrated Circuit (I$^2$C), System Management Bus (SMBus), or any other serial standard desired.

An advantage of the present invention is that the SPI 106 only requires three external connections, thus minimizing pin count of the IC package. A chip select ($\overline{CS}$), for example, active low, a serial clock input (SCK) and a serial data input (SI) are all that are needed for complete control and status of the amplifier 100. Data and commands may be sent to the amplifier 100 by appropriate timing on these signal inputs. For example, data may be shifted into the amplifier 100 when $\overline{CS}$ is at a low logic level and SCK is allowed to toggle. At the rising edge of the signal at SCK, data on the SI is shifted into the amplifier 100. This data may be latched (latch not shown) and acted upon at the rising edge of the signal at $\overline{CS}$. In addition, a serial data output (SO) maybe used for daisy chaining to other peripheral devices (not shown) using the same $\overline{CS}$ signal. This feature saves additional chip select connections to the digital processor (not shown). Other variations of serial interfaces may be, for example but not limited to, serial peripheral interface (SPI), Inter-Integrated Circuit (I$^2$C), System Management Bus (SMBus) and the like.

The SPI 106 may also control the MUX 104, illustrated with eight inputs, CH0–CH7, more or fewer inputs are also contemplated and within the scope of the present invention. The MUX 104 is optional and the present invention may also function without a MUX, or may utilize an external MUX, depending upon system requirements.

The operational characteristics setting element selection switches 110 control selection of the operational characteristics setting elements 112 and are generally positioned between the operational characteristics setting elements (e.g., resistors, diodes, transistors, capacitors and/or inductors) and the high-impedance inverting input of the operational amplifier 102 to reduce distortion, increase bandwidth and improve gain accuracy. The operational characteristics setting elements 112 may also be coupled to a voltage reference, $V_{REF}$, which may be part of the integrated circuit die 114 or may be an external (off chip) voltage reference. More than one voltage reference may also be utilized with the present invention and is contemplated herein.

Figure 2:
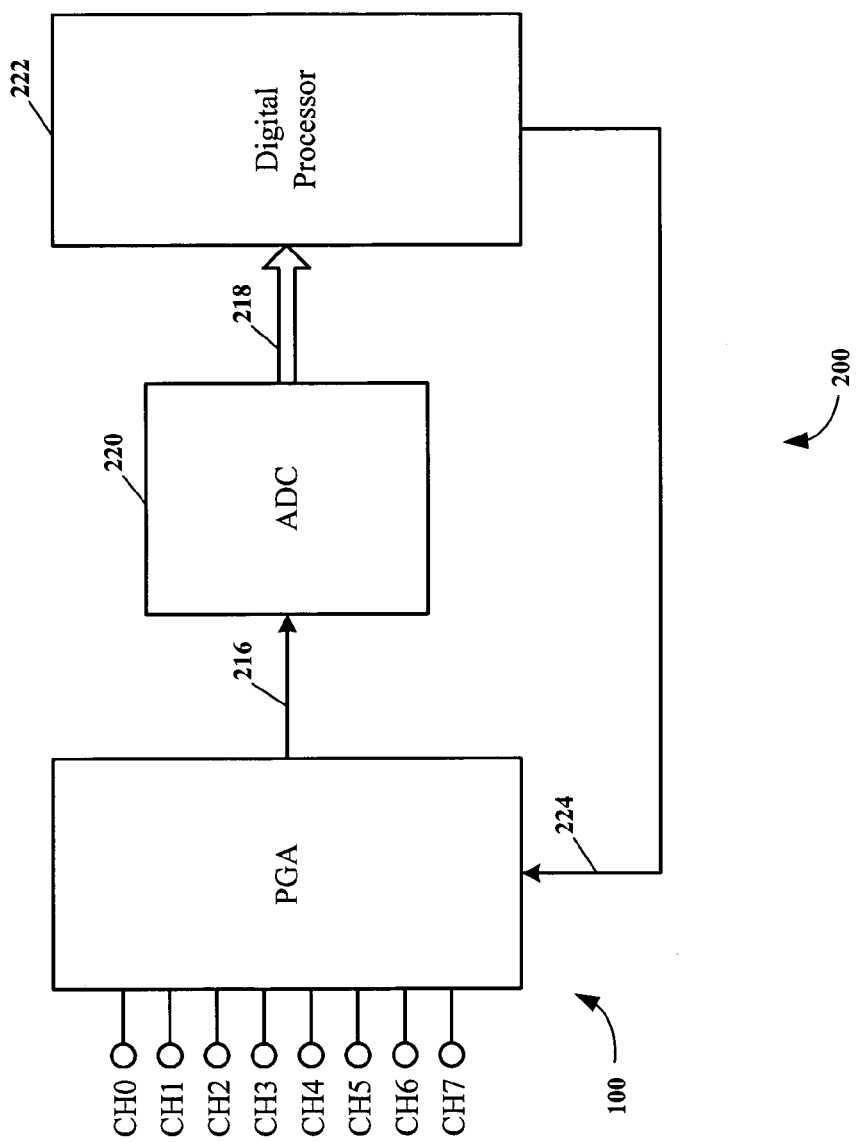
FIG. 2 illustrates a schematic block diagram of an exemplary system utilizing the embodiment of FIG. 1.

Referring to FIG. 2, depicted is a schematic block diagram of an exemplary system utilizing the embodiment of FIG. 1. The system, generally represented by the numeral 200, comprises the amplifier 100, an analog-to-digital converter (ADC) 220 and a digital processor 222. Illustrated is the amplifier 100 with eight analog inputs, CH0–CH7, and an analog output 216 coupled to an input of the ADC 220. The ADC 220 may be any type of ADC known to those skilled in the art of analog to digital conversion. The ADC 220 has a digital output 218 coupled to the digital processor 222. The digital processor 222 has a serial peripheral interface coupled to over a serial bus 224 to the SPI 106 (FIG. 1). A serial peripheral interface (SPI), Inter-Integrated Circuit (I$^2$C), System Management Bus (SMBus) or any other type of serial interface may also be utilized, according to the present invention. The digital processor 222 may be, for example, a microprocessor, a microcontroller, a digital signal processor (DSP), a programmable logic array (PLA), an application specific integrated circuit (ASIC) and the like.

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A system for analog signal processing, said system comprising:
    an amplifier having programmable operational characteristics, the amplifier comprising:
        an operational amplifier,
        operational characteristics setting elements for setting operational characteristics of the operational amplifier,
        operational characteristics setting element selection switches coupled between the operational characteristics setting elements and the operational amplifier, and
        a serial communications interface, wherein the serial communications interface controls the operational characteristics setting element selection switches;
    an analog-to-digital converter, wherein an input of the analog-to-digital converter is coupled to an output of the operational amplifier; and
    a digital processor, wherein the digital processor is coupled to the output of the analog-to-digital converter and to the serial communications interface.

2. The system according to claim 1, wherein the serial communications interface is selected from the group consisting of a serial peripheral interface (SPI), an Inter-Integrated Circuit bus interface, and a System Management Bus (SMBus) interface.

3. The system according to claim 2, wherein the serial peripheral interface comprises a chip select, a serial clock input and a serial data input.

4. The system according to claim 3, wherein the serial peripheral interface further comprises a serial data output.

5. The system according to claim 1, wherein the operational characteristics are selected from one or more of the group consisting of gain, high pass filter frequency cutoff, low pass filter frequency cutoff, band pass filter frequency, phase delay, and quality (Q).

6. The system according to claim 1, further comprising a memory coupled to the serial communications interface.

7. The system according to claim 6, wherein the memory is volatile.

8. The system according to claim 6, wherein the memory is non-volatile.

9. The system according to claim 1, further comprising an analog multiplexer having a plurality of analog inputs and an analog output, the analog output coupled to an input of the operational amplifier.

10. The system according to claim 9, wherein the analog multiplexer is controlled by the serial communications interface.

11. The system according to claim 1, wherein the digital processor is selected from the group consisting of a microprocessor, a microcontroller, a digital signal processor (DSP), a programmable logic array (PLA) and an application specific integrated circuit (ASIC).

12. A system for analog signal processing, said system comprising:

an amplifier having programmable operational characteristics, the amplifier comprising:
a plurality of operational amplifiers,
operational characteristics setting elements for setting operational characteristics for each of the plurality of operational amplifiers,
operational characteristics setting element selection switches coupled between the operational characteristics setting elements and the respective ones of the plurality of operational amplifiers, and
a serial communications interface, wherein the serial communications interface controls the operational characteristics setting element selection switches;
at least one analog-to-digital converter, wherein a respective input of the at least one analog-to-digital converter is coupled to an output of a respective one of the plurality of operational amplifiers; and
a digital processor, wherein the digital processor is coupled to the output of the at least one analog-to-digital converter and to the serial communications interface.

13. The system according to claim 12, further comprising an analog multiplexer having a plurality of analog inputs and analog outputs, the plurality of analog outputs coupled to respective inputs of the plurality of operational amplifiers.

14. The system according to claim 13, wherein the analog multiplexer is controlled by the serial communications interface.

15. The system according to claim 12, wherein the digital processor is selected from the group consisting of a microprocessor, a microcontroller, a digital signal processor (DSP), a programmable logic array (PLA) and an application specific integrated circuit (ASIC).

16. The system according to claim 12, comprising at least one serial communications interface chosen from a serial peripheral interface (SPI), an Inter-Integrated Circuit interface, and a System Management Bus (SMBus) interface.

17. The system according to claim 12, comprising at least one operational characteristic chosen from gain, high pass filter frequency cutoff, low pass filter frequency cutoff, band pass filter frequency, phase delay, and quality (Q).

18. A integrated circuit amplifier having programmable operational characteristics, the integrated circuit amplifier comprising:
a plurality of operational amplifiers, each one having inverting and non-inverting inputs and an output;
operational characteristics setting elements for setting the operational characteristics of each of the operational amplifiers;
operational characteristics setting element selection switches coupled between the operational characteristics setting elements and the plurality of operational amplifiers;
an analog multiplexer having a plurality of analog inputs and a plurality of analog outputs, the plurality of analog outputs coupled to non-inverting inputs of respective ones of the plurality of operational amplifiers; and
a serial communications interface, wherein the serial communications interface controls the operational characteristics setting element selection switches and the analog multiplexer.

19. The integrated circuit amplifier according to claim 18, comprising at least one serial communications interface chosen from a serial peripheral interface (SPI), an Inter-Integrated Circuit bus interface, and a System Management Bus (SMBus) interface.

20. The integrated circuit amplifier according to claim 19, wherein the serial peripheral interface comprises a chip select, a serial clock input and a serial data input.

21. The integrated circuit amplifier according to claim 20, wherein the serial peripheral interface further comprises a serial data input.

22. The integrated circuit amplifier according to claim 18, comprising at least one operational characteristics chosen from gain, high pass filter frequency cutoff, low pass filter frequency cutoff, band pass filter frequency, phase delay, and quality (Q).

23. The integrated circuit amplifier according to claim 18, further comprising an integrated circuit package.

24. The integrated circuit amplifier according to claim 23, comprising at least one integrated circuit package chosen from a flip-chip package, a plastic package, an eopxy package, and a ceramic package.

25. The integrated circuit amplifier according to claim 24, comprising at least one integrated circuit package chosen from PDIP, SOIC, MSOP, TSSOP and QSOP.

26. The integrated circuit amplifier according to claim 18, further comprising a power-on-reset circuit for setting the serial communications interface to a predetermined state.

27. The integrated circuit amplifier according to claim 26, further comprising a memory coupled to the serial communications interface.

28. The integrated circuit amplifier according to claim 27, wherein the memory is volatile.

29. The integrated circuit circuit amplifier according to claim 27, wherein the memory is non-volatile.

* * * * *

UNITED STATES PATENT AND TRADEMARK OFFICE
CERTIFICATE OF CORRECTION

| | | |
|---|---|---|
| PATENT NO. | : 7,505,855 B2 | |
| APPLICATION NO. | : 11/040354 | |
| DATED | : March 17, 2009 | |
| INVENTOR(S) | : Kumen E. Blake et al. | |

It is certified that error appears in the above-identified patent and that said Letters Patent is hereby corrected as shown below:

Column 9, Line 35, the phrase "an Inter-Integrated Circuit interface" should be changed to --an Inter-Integrated Circuit bus interface--; and Column 10, Line 46 of the issued grant needs correction: The word "circuit" should be deleted.

Signed and Sealed this
Twenty-sixth Day of April, 2011

David J. Kappos
*Director of the United States Patent and Trademark Office*